(12) United States Patent
Potts

(10) Patent No.: US 7,180,105 B2
(45) Date of Patent: Feb. 20, 2007

(54) NORMALLY OFF JFET

(75) Inventor: Alan Potts, Gwent (GB)

(73) Assignee: International Rectifier Corporation, El Segundo, CA (US)

( * ) Notice: Subject to any disclaimer, the term of this patent is extended or adjusted under 35 U.S.C. 154(b) by 13 days.

(21) Appl. No.: 11/053,312

(22) Filed: Feb. 8, 2005

(65) Prior Publication Data

US 2005/0173726 A1    Aug. 11, 2005

Related U.S. Application Data

(60) Provisional application No. 60/543,163, filed on Feb. 9, 2004.

(51) Int. Cl.
*H01L 29/80* (2006.01)

(52) U.S. Cl. .............. 257/256; 237/264; 237/268; 237/287; 237/E29.226; 438/186

(58) Field of Classification Search ............ 257/256, 257/264, 268, 287; 438/186
See application file for complete search history.

(56) References Cited

U.S. PATENT DOCUMENTS

| | | | | |
|---|---|---|---|---|
| 5,378,642 | A * | 1/1995 | Brown et al. | 438/186 |
| 5,889,298 | A * | 3/1999 | Plumton et al. | 257/285 |
| 6,207,994 | B1 * | 3/2001 | Rumennik et al. | 257/342 |
| 6,307,223 | B1 * | 10/2001 | Yu | 257/256 |
| 6,459,108 | B1 * | 10/2002 | Bartsch et al. | 257/263 |
| 6,674,107 | B1 * | 1/2004 | Yu | 257/266 |
| 2002/0167011 | A1 * | 11/2002 | Kumar et al. | 257/77 |
| 2003/0168704 | A1 * | 9/2003 | Harada et al. | 257/368 |

* cited by examiner

*Primary Examiner*—Jerome Jackson
*Assistant Examiner*—Paul Budd
(74) *Attorney, Agent, or Firm*—Ostrolenk, Faber, Gerb & Soffen, LLP

(57) ABSTRACT

A normally off JFET is formed by the implantation of a P base; and a shallower P island atop the P base, forming a narrow lateral conduction channel between the two and a shallow gate implant in the device top surface which forms a second lateral conduction channel with the island. The two channels are each less than 0.5 microns thick and have an impurity concentration such that the channels are depleted at zero gate voltage and are turned on when the gate is forward biased. The gate surrounds a source implant region and a remote drain is provided which is connected to the top surface of the device for a lateral JFET or the bottom of the device for a vertical conduction JFET.

13 Claims, 2 Drawing Sheets

NORMALLY OFF JFET

RELATED APPLICATION

This application claims the benefit of U.S. Provisional Application No. 60/543,163, filed Feb. 9, 2004

FIELD OF THE INVENTION

This invention relates to semiconductor devices and more specifically relates to a junction field effect transistor (JFET) which is normally off.

BACKGROUND OF THE INVENTION

JFETs are well known transistors having numerous desirable characteristics. However, JFETs are normally-on devices and are turned off by the application of a gate bias. In many application circuits a normally-off transistor is needed so that the JFET cannot be used for such applications without additional gate control circuits.

It would be very desirable to provide a JFET which is normally-off; that is, non-conductive in the absence of the presence of a gate turn off signal, and which is turned on by the presence of a gate signal.

BRIEF DESCRIPTION OF THE INVENTION

In accordance with the present invention, a novel JFET is provided which is in the normally-off condition (in the absence of a gate bias voltage).

In the present invention a plurality of limited area conduction channels are interposed in the current path from a source to a drain region. These conduction channels are defined between a gate region and a base region which are each of conductivity types opposite to that of the conduction or drift region, with a further island of the opposite conductivity type interposed between the base and gate regions. The channels between the island and the base and between the island and the gate are each sufficiently narrow and the related concentration of the conduction channel in the gaps is sufficiently low, that the channel gaps are completely depleted when the gate bias $V_{gs}$ is zero. Thus, the device becomes a normally-off device. A forward bias $V_{gs}$ will then turn on or open up the channels, turning on the device between source and drain.

The novel device of the inventions can be implemented as either a lateral conduction or vertical conduction device, with the major processing steps, comprising the implant of the base, the implant of the island(s), and the implant of gate, source and drain contact regions. No diffusion cycles are used, except a rapid thermal anneal is used to activate the implanted dopants. No oxidation cycles, no silicidation and no trenching of the silicon is required, thus simplifying the process.

The final device will have a very low product of on resistance $R_{DSON}$ and area for a given break-down voltage $BV_{dss}$. Multiple channel options are also available.

DETAILED DESCRIPTION OF PREFERRED EMBODIMENTS

Figure 1:
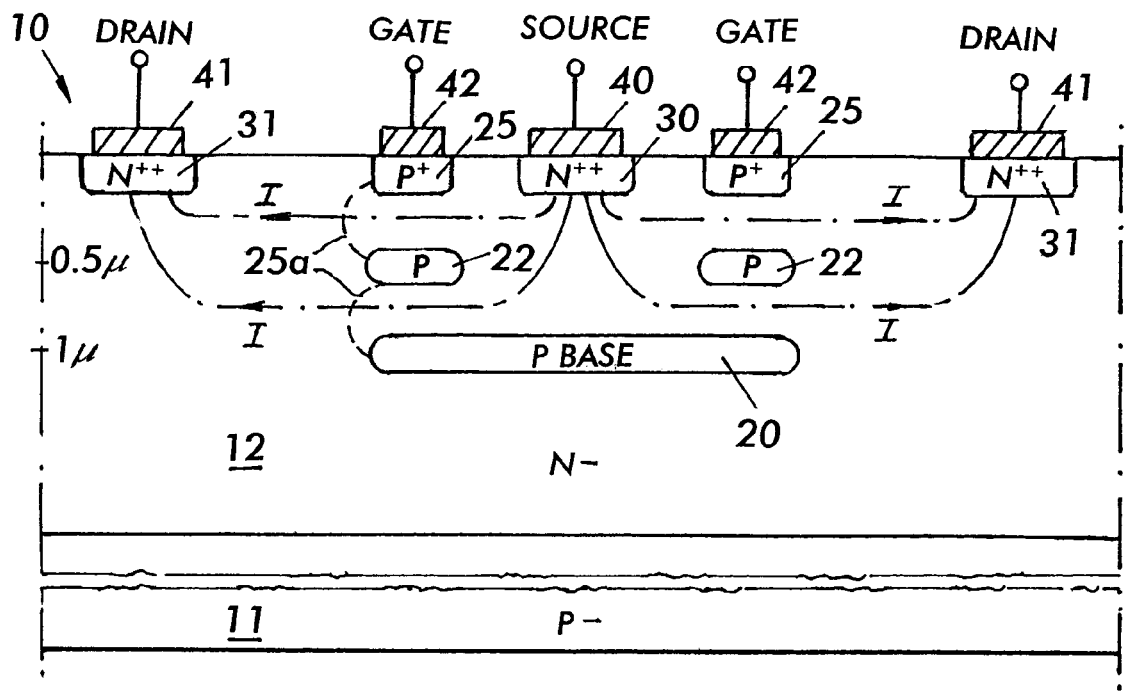
FIG. 1 is a cross-sectional view of a small portion of a lateral conduction device made in accordance with the invention and is a cross-section of FIG. 2, taken across section line 1—1 in FIG. 2.
Figure 2:
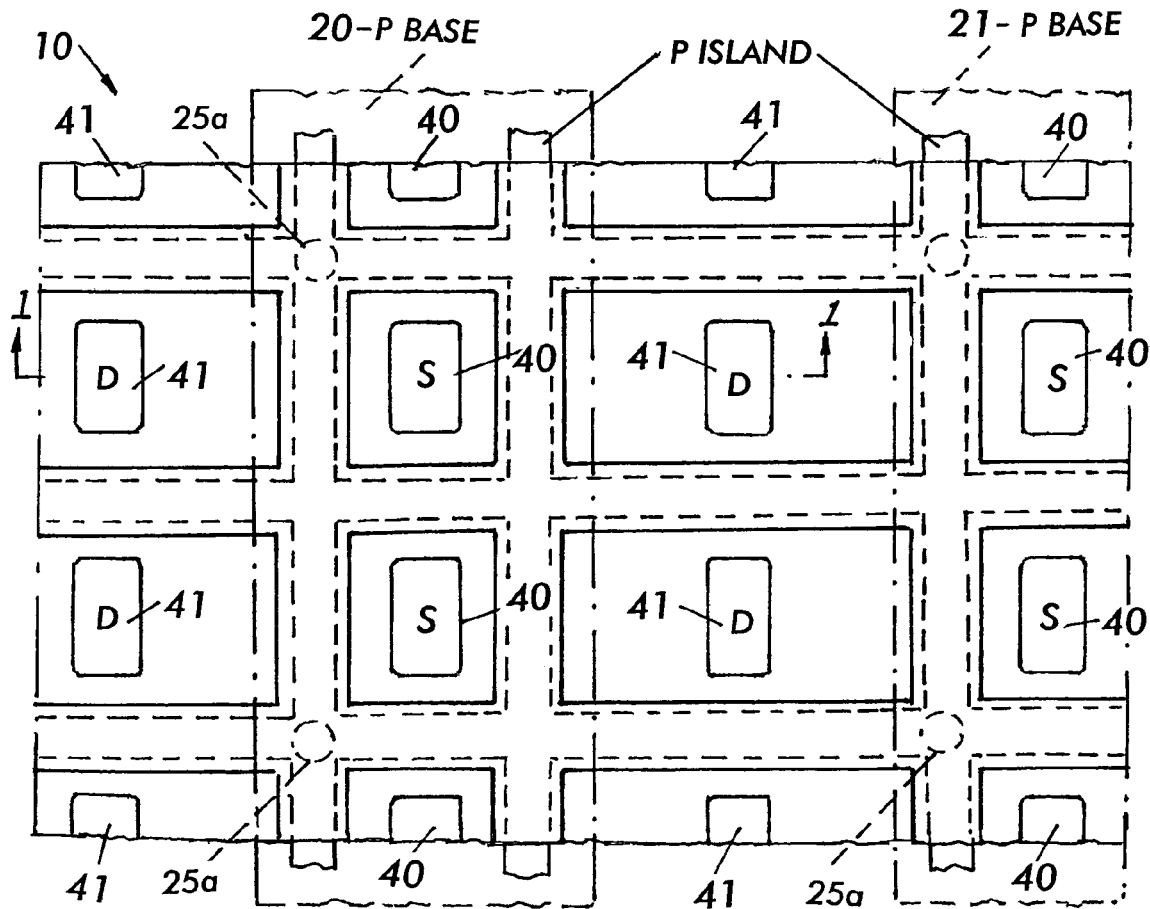
FIG. 2 is a top view of the chip (or wafer) of FIG. 1.

Referring first to FIGS. 1 and 2, there is shown a small portion of a wafer (or chip or die) 10 of silicon which has a P⁻ substrate 11 which may have any desired thickness and which has an N⁻ epitaxially deposited layer 12 thereon. Layer 12 may have a thickness of about 2.0 microns and a low impurity concentration, for example $1E16/cm^3$.

A plurality of P bases 20 and 21 (FIG. 2) are implanted into the body of layer 12, and have a depth of about 1.0 micron and a thickness of about 0.05 microns. A P type grid or a P type "island" (in cross-section) 22 is next implanted to a depth of about 0.5 microns in the body of layer 12, and with a thickness of about 0.05 microns.

A P shallow gate contact implant 25 is then implanted into the top of layer 12 and aligned to the grid 22; and N⁺⁺ source and drain contact regions 30 and 31 respectively are also implanted into the top surface of region 12. Aluminum source contacts 40 are then formed atop region 30; aluminum drain contacts 41 are formed atop drain regions 31 and aluminum gate contact lattice 42 is formed atop the P gate implant lattice 25.

Preferably, localized P-type implants shown schematically as implants 25a in FIGS. 1 and 2 connect the shallow P implant 25 to the P-type islands 22 and the P-type base 20. This permits proper gate bias control over the channel regions. The P-type base 20 and islands 22 will also be forward biased with respect to the source with the implants 25a.

It is best seen in FIG. 1 that very narrow current conduction channels are formed between the P base 20 and P islands (or grid) 22; and between the islands 22 and gate contact region 25. These channels are each less than about 0.5 microns wide (high). The current paths through these channels from source through a drain drift region to a drain contact, as shown by the arrows I in FIG. 1.

The highest of the two parallel channels is sufficiently small, and the N⁻ concentration of the channels is sufficiently low ($1E16/cm^3$) that the channels will be depleted out at zero bias voltage $V_{gs}$ between the gate 42 and sources 30. Thus, the device is normally non-conducting or normally off. When, however, the gate 42 is forward biased the gate opens up the channels and current will flow as shown between source 40 and drain 41.

Figure 3:
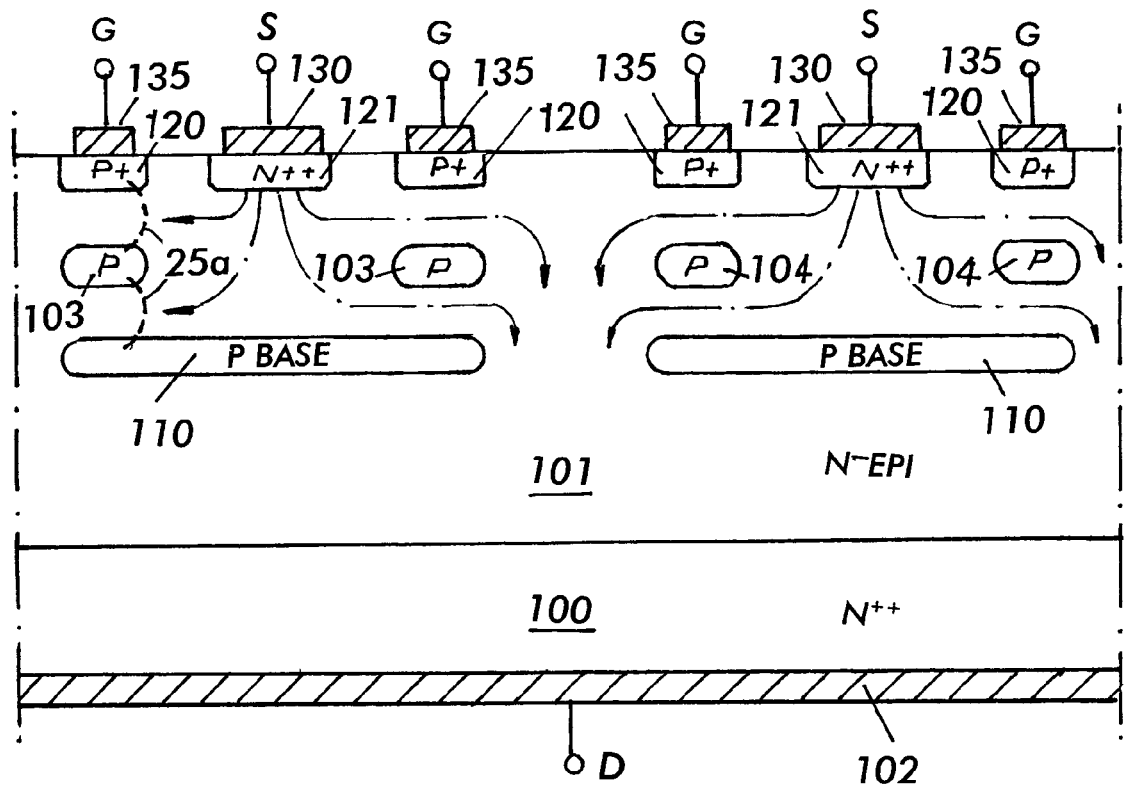
FIG. 3 is a cross-section of a small portion of a vertical conduction device made in accordance with the invention and is a cross-section of FIG. 4 taken across section line 3—3 in FIG. 4.
Figure 4:
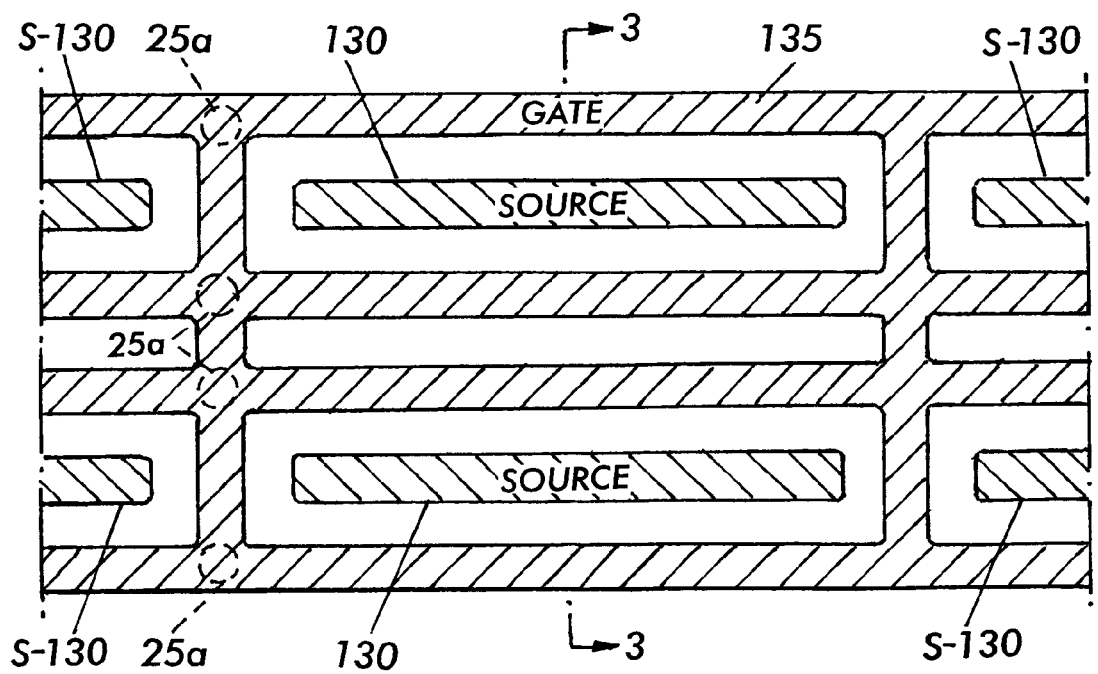
FIG. 4 is a top view of the chip or die of FIG. 3.

FIGS. 3 and 4 show the implementation of the invention for a vertical conduction device which will have a lower $R_{DSON}$ than the lateral version. In the device of FIGS. 3 and 4, the basic wafer has an N⁺⁺ substrate 100 and an N⁻ epitaxial grown layer 101 thereon which, again may have an impurity concentration of $1E16/cm^3$. A drain electrode 102 is formed on the bottom of substrate 100.

As in FIGS. 1 and 2, P bases 110 (FIG. 3) are implanted into the top of N⁻ region 101 and P islands (grids) 103 and 104 are formed atop respective ones of P bases 110, to form a first conduction channel about 0.5 microns wide.

The islands 103 and 104 are aligned with P⁺ contact implants 120 and are spaced therefrom by about 0.5 microns. N⁺⁺ source contact implants 121 are also formed into the top of layer 101 and they receive source contacts 130. A gate contact grid 135 is arranged to surround each of the sources 130. Note that the P-type implants 25a are also present in FIGS. 3 and 4, as in FIGS. 1 and 2 at the intersections of the P island grid.

As in FIGS. 1 and 2, the very narrow channels are depleted when the gate to source voltage is zero, and are turned on when the gate is forward biased. The current flow between drain and source is shown by arrows in FIG. 3 and flows to the drain drift region and vertically to the drain through the gap between the P bases 110.

A brief comparison of the $R_{DSON}$ and $BV_{dss}$ for the horizontal JFET (FIGS. 1 and 2) and the vertical JFET (FIGS. 3 and 4) to a commercial trench MOSFET type IRF7822 made by the International Rectifier corporation is as follows:

|  | IRF7822 | Vertical JFET | Horizontal JFET |
|---|---|---|---|
| Specific $R_{DS(ON)}$ milliohms cm | 26 | 20.8 | 35.0 |
| $BV_{dss}$ (Volts) | 30 (min) | 49 | 66 |

The Figures for the JFET embodiments are calculated from computer simulations.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A normally off JFET comprising:
   a die of silicon having a top and bottom surface;
   said die having a substrate extending from said bottom surface, and an epitaxial layer of one conductivity type atop said substrate and extending to said top surface;
   said top surface having at least one shallow source contact implant region of said one conductivity type, and a first shallow gate implant region of the other conductivity type and a second shallow gate implant region of the other conductivity type each laterally spaced from said shallow source contact implant region whereby said shallow source contact implant region is disposed between said first and said second shallow gate implant regions;
   at least one shallow implanted island of said other conductivity type formed beneath each said shallow gate implant and spaced therefrom to form at least a first lateral conduction channel which extends to a drain drift region; and
   at least one implanted base of said other conductivity type extending beneath said shallow implanted islands and said shallow source contact implant region, said at least one implanted region being adjacent to second lateral conduction channels, each disposed beneath and parallel to a respective said first lateral conduction channel, the dimensions of said first and second channels and the concentration of impurities in said first and second channels being configured so that said first and second channels are fully depleted when the gate voltage is zero relative to said source region.

2. The device of claim 1 which further includes a source contact, a gate contact and a drain contact connected to said source, gate and drain drift regions respectively.

3. The device of claim 2 wherein said drain contact is on said top surface to define a lateral conduction JFET.

4. The device of claim 2 wherein said drain contact is on said bottom surface to define a vertical conduction JFET.

5. The device of claim 1, wherein both of said first and second channels have a width less than about 0.5 micron.

6. The device of claim 2, wherein both of said first and second channel have a width less than about 0.5 micron.

7. The device of claim 4, wherein both of said first and second channel have a width less than about 0.5 micron.

8. The device of claim 4, wherein both of said first and second channel have a width less than about 0.5 micron.

9. The device of claim 1, wherein said shallow gate implant surrounds and is spaced from said shallow source implant and wherein said implanted island has a topology to match that of said shallow gate implant.

10. The device of claim 2, wherein said shallow gate implant surrounds and is spaced from said shallow source implant and wherein said implanted island has a topology to match that of said shallow gate implant.

11. The device of claim 3, wherein said shallow gate implant region surrounds and is spaced from said shallow source implant and
   wherein said implanted island has a topology to match that of said shallow gate implant.

12. The device of claim 4, wherein said shallow gate implant surrounds and spaced from said shallow source implant and wherein said implanted island has a topology to match that of said shallow gate implant.

13. The device of claim 5, wherein said shallow gate implant surrounds and spaced from said shallow source implant and wherein said implanted island has a topology to match that of said shallow gate implant.

* * * * *